(12) United States Patent
Engholm et al.

(10) Patent No.: US 8,705,598 B2
(45) Date of Patent: Apr. 22, 2014

(54) SIGNAL-SENSITIVE DATA COMPRESSION

(75) Inventors: Kathryn A. Engholm, Portland, OR (US); Marcus K. Da Silva, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 292 days.

(21) Appl. No.: 13/326,735

(22) Filed: Dec. 15, 2011

(65) Prior Publication Data

US 2013/0156082 A1    Jun. 20, 2013

(51) Int. Cl.
    *H04B 3/46*    (2006.01)
(52) U.S. Cl.
    USPC .......................................................... 375/224
(58) Field of Classification Search
    USPC ........................................ 375/224, 227–228
    See application file for complete search history.

(56) References Cited

U.S. PATENT DOCUMENTS

| 5,852,633 | A  | * | 12/1998 | Levin et al. | ................... | 375/130 |
| 6,141,317 | A  | * | 10/2000 | Marchok et al. | ............... | 370/208 |
| 6,452,907 | B1 | * | 9/2002  | Levin | ............................ | 370/252 |
| 8,351,367 | B2 | * | 1/2013  | Yellin et al. | ................... | 370/317 |

* cited by examiner

*Primary Examiner* — Khanh C Tran
(74) *Attorney, Agent, or Firm* — Michael A. Nelson; Marger Johnson & McCollom PC

(57) ABSTRACT

A test and measurement instrument includes an input for receiving an input test signal and a separator that separates a data array of the input test signal into a number of different data bins. Each data bin includes a number of data points. A selector is included that determines whether the data points within a present bin of the total bins represent signal or noise. When the present bin contains noise, a processor generates a first output for the present bin. Instead, when the present bin contains signal, the processor generates a second output for the present bin. The bin outputs can then be combined to make an output array, such as a waveform display, for the instrument.

21 Claims, 5 Drawing Sheets

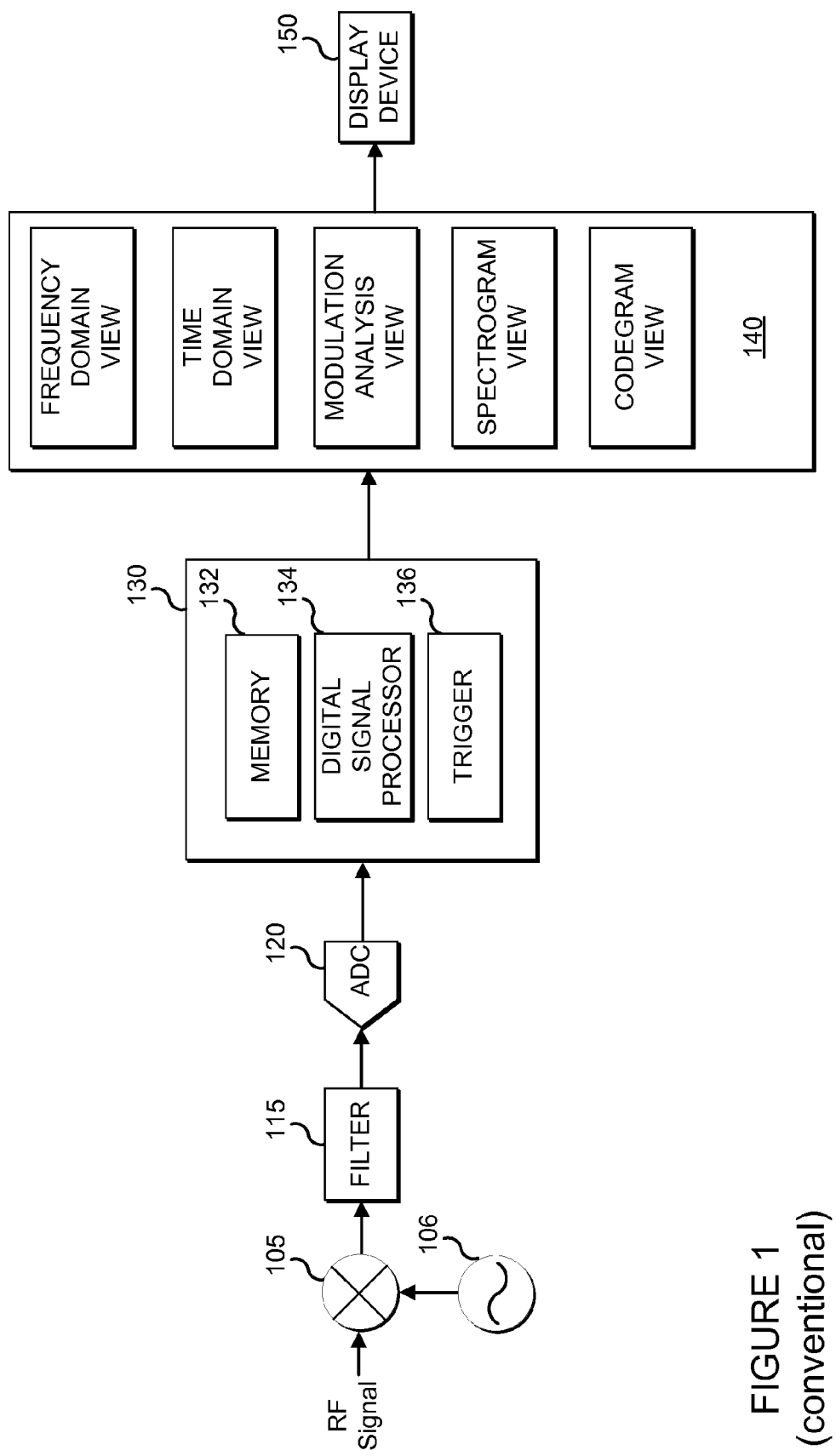
FIGURE 1
(conventional)

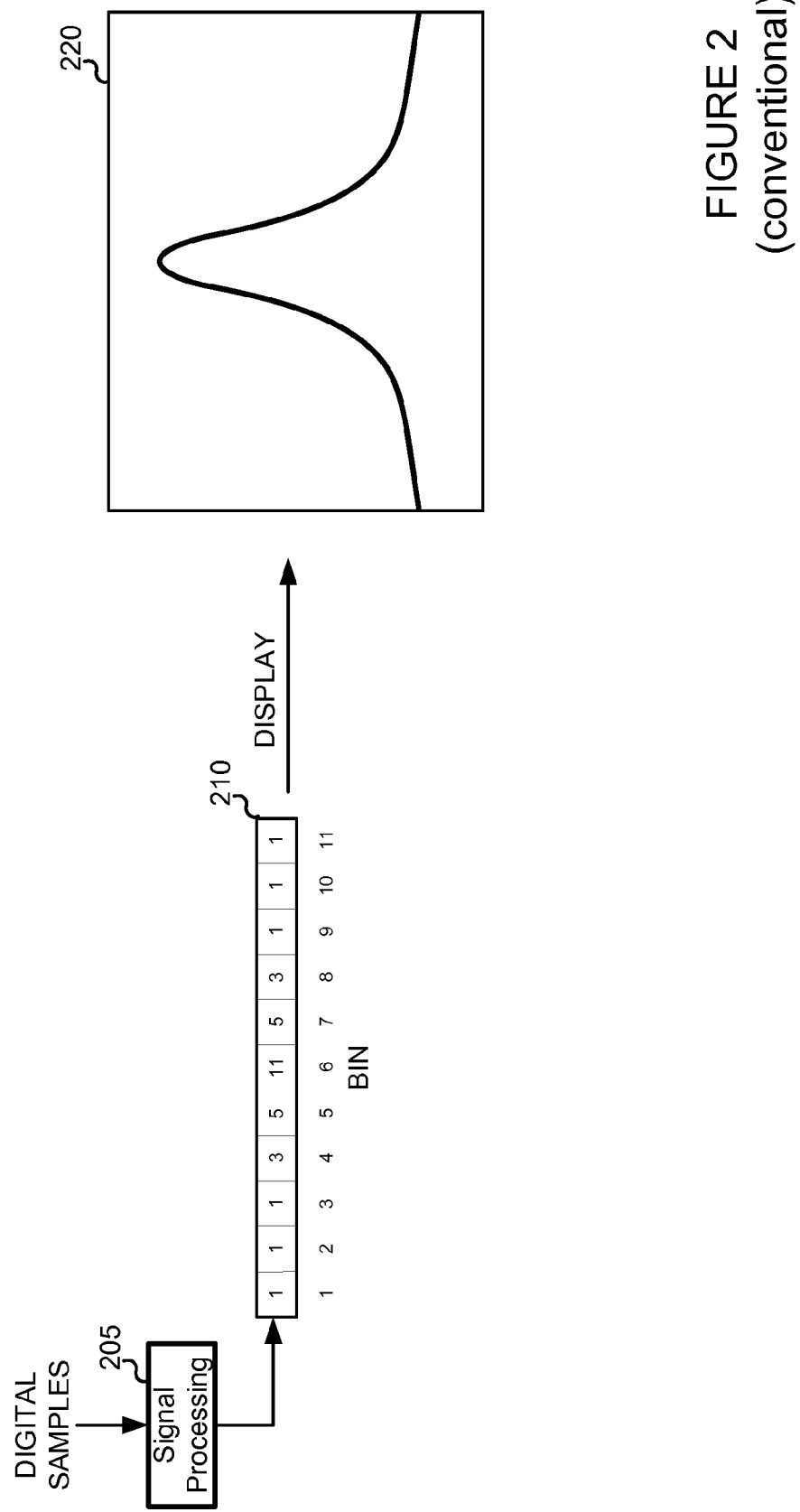
FIGURE 2 (conventional)

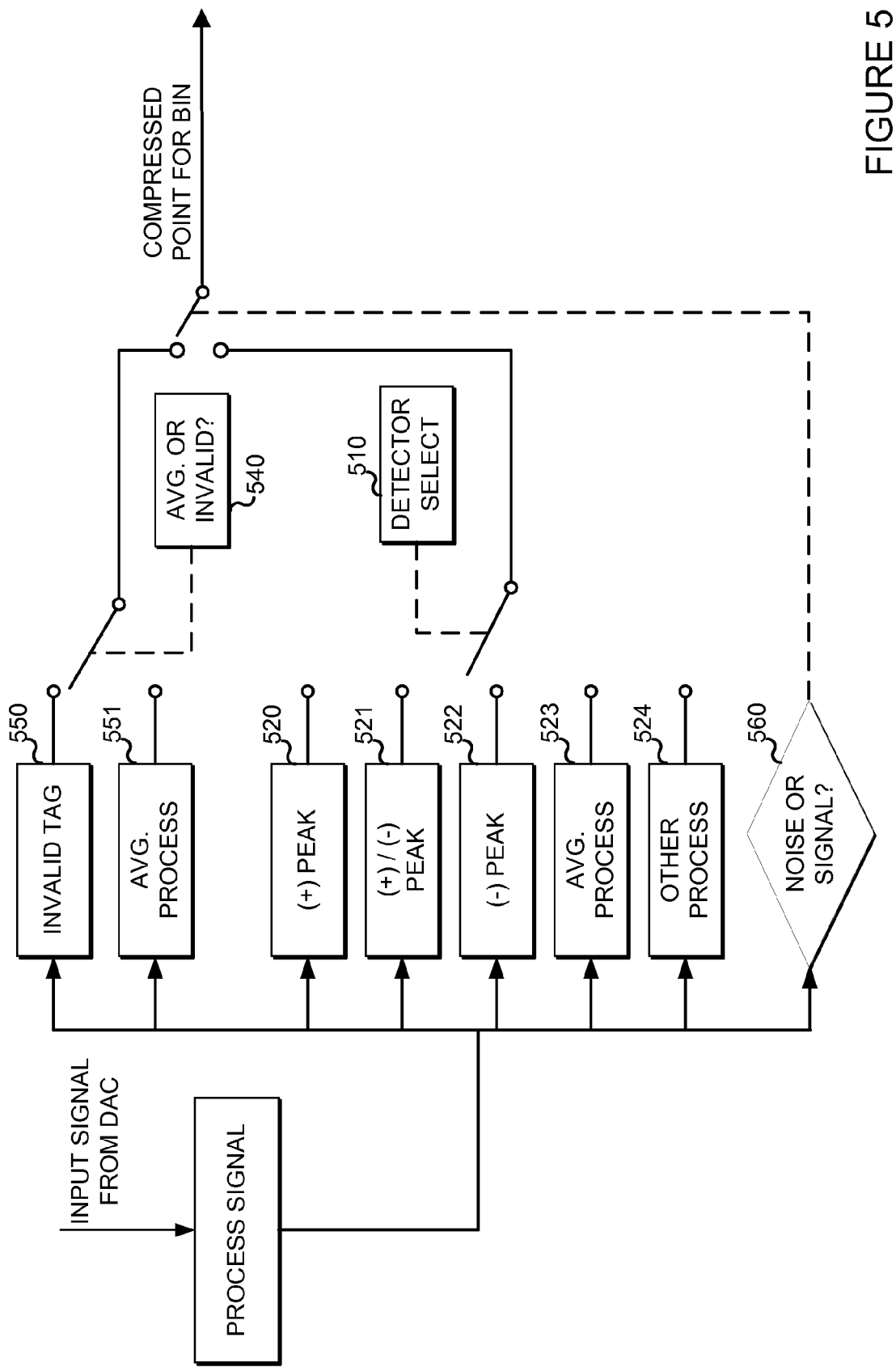

SIGNAL-SENSITIVE DATA COMPRESSION

FIELD OF THE INVENTION

This disclosure is directed toward test and measurement instruments, and, more particularly, to an instrument having signal-sensitive data compression.

BACKGROUND

Real-time spectrum analyzers (RTSAs) such as the RSA6100, RSA5100, and RSA3400 families available from Tektronix, Inc. of Beaverton, Oregon trigger on, capture, and analyze RF signals in real-time. These test and measurement instruments seamlessly capture RF signals so that, unlike conventional swept spectrum analyzers and vector signal analyzers, no data is missed within a specified bandwidth.

FIG. 1 is a simplified block diagram of portions of an RTSA. A mixer 105 in conjunction with a local oscillator 106 converts or tunes the input, which may also be filtered, to an intermediate frequency (IF). A filter 115 may further refine the IF signal before it is passed to an analog-to-digital (A/D) converter 120 to provide a digital signal for further processing. The digital signal is passed to a processor 130 that provides triggering, memory, and analysis functions. In some embodiments the memory 132 may be implemented using a circular buffer. When the trigger generator 136 detects a trigger event, a trigger signal is generated that causes the memory 132 to store a seamless block of digital data from the digital signal for subsequent processing by a digital signal processor 134, or for offloading to another processor (not shown) for non-real-time post-processing. A user may select a particular view 140 for viewing the measured signal on a display device 150.

Historically, spectrum analyzers use detectors to determine what signal power value to display at a specific frequency point. The detector was needed because the level of the signal under test could vary during the finite time period during which it was being measured by the analyzer. Common detector types include Average, +Peak, −Peak, Sample, and Quasi-Peak.

A problem with current detectors is that the user must choose the right detector for the particular signal and measurement combination the user is working with at the time. For example, when measuring power of a narrow-band signal, the +Peak detector is usually most appropriate, but the Average detector is usually most appropriate when measuring the level of the noise floor. Thus, detection methods are optimized for accurately displaying either signal levels or for noise levels, but not for both.

Embodiments of the invention address these and other limitations of the prior art.

SUMMARY OF THE INVENTION

Modern spectrum analyzers, particularly real-time spectrum analyzers, typically implement detectors in software. This form of "detection" is done by decimating a power-vs-frequency data array. It is used when the original data array contains more points than will be used later in the measurement/display process. For each frequency point, or "bin" in the post-decimation array, a number of values of multiple data points in the original data array are combined into a single output value for the bin. The detection methods in use today are optimized for accurately displaying either signal levels or for noise levels, but not for both.

In some instances there are some applications such as pulsed or intermittent signals, or time-invariant signals, for which a combination of detectors are most appropriate for different portions of the same data record. For instance, an Average detector may be most appropriate for frequency bins that do not contain signals, while the +Peak detector may be the most appropriate for frequency bins that do contain signals.

In the case of trying to analyze signals that are near the noise level, users traditionally use multiple-trace processing, such as averaging many results traces together, to make it easier to distinguish the signal from the noise. This method takes extra time, and it is not applicable for transient signals.

Embodiments of the invention address this deficiency by using different compression detectors, or algorithms, for different bins in the same data record. Further, embodiments of the invention automatically determine the appropriate detector to use for each bin.

In one first embodiment, a test and measurement instrument includes an input for receiving an input test signal and a separator structured to separate a data array of the input test signal into a number of different data bins. Each data bin includes a number of data points. A selector is included that determines whether the data points within a present bin of the total bins represent signal or noise. When the present bin contains noise, a processor generates a first output for the present bin. Instead, when the present bin contains signal, the processor generates a second output for the present bin.

BRIEF DESCRIPTION OF THE DRAWINGS

FIG. 1 is a functional block diagram of a conventional real-time spectrum analyzer.

FIG. 2 is a functional block diagram of portions of a signal analyzer illustrating how conventionally binned data is output to become a final display output.

FIG. 5 is a functional block diagram of components of a system that compresses data based on dynamic considerations according to embodiments of the invention.

DETAILED DESCRIPTION

FIG. 2 is a functional block diagram of portions of a signal analyzer illustrating how conventionally binned data is output to become a final display output. After a test signal is digitized, such as by an analog-to-digital converter, the signals may be processed by a signal processor 205. This may include, for instance, performing a Fourier transform, chirp-Z or other process to convert time domain signals into the frequency domain, or other processing. Other processes may keep the digital samples in the time domain without converting them to the frequency domain. Embodiments of the invention digital may work in either the time or frequency domain. Qualities of the sampled measured signals, for example, an amplitude of the signal, is measured and quantized into an array or database 210, which stores data of a measurement signal to be generated. The database 210 may be converted to an output signal and shown on a display 220. The test signal may be a continuous signal and the database 210 periodically updated, along with its resultant display.

Figure 3:
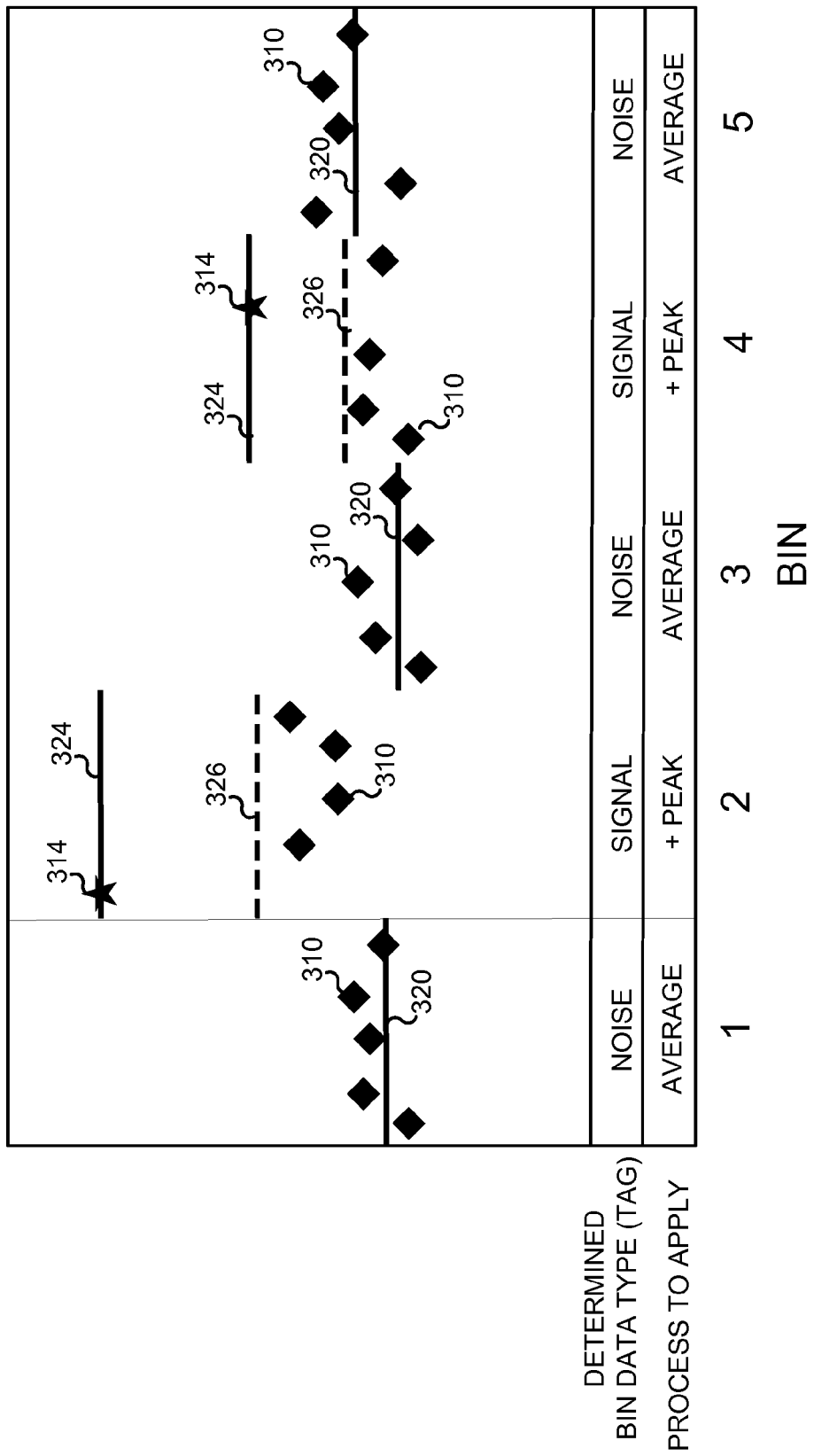
FIG. 3 is a conceptual diagram illustrating data points in example bins, the determined bin data type, the process applied to the data in the bins, and the resultant bin output.

FIG. 3 is a conceptual diagram illustrating data points in example bins, the determined bin data type, the process applied to the data in the bins, and the resultant bin output. In FIG. 3, five bins are illustrated, which may be examples of the eleven bins of FIG. 2. Each separate bin, Bin 1 through Bin 5, includes a number of data points 310 that represent measured values of the signal under test. In some embodiments each bin may represent data points of the signal under test for particular, separate, frequencies. In other embodiments the bins may have different divisions, such a time, where each data point represents measured values of the signal under test at various times.

For each bin being analyzed, the input data points 310 are examined to determine whether they contain a signal or only noise. This determination may be made using widely-known signal processing methods. For example, a set of contiguous data points within a bin, such as Bin 1, can be analyzed to determine whether it contains only random noise or not. Determining whether the input data points 310 of a bin contain signals or only noise can be done with statistical processing, for example. The probability of making a correct determination improves with the signal-to-noise ratio of the input. Further, if a non-noise signal is detected, it can be determined in software whether the signal's level is higher or lower in amplitude than the random noise surrounding it.

A practical implementation is a "Signal" detector type. For each output bin, Bin 1-Bin 5, the input data points 310 are examined to determine whether they contain a signal or only noise. If noise, an Average decimation algorithm is applied, which produces an output value 320 that is the average value of the input points 310 measured values. In FIG. 3, such a process determined that Bin 1, Bin 3, and Bin 5 include only noise, and therefore outputs for those bins is the average 320 of the data points 310 in each respective bin. Instead, if the input data points 310 for a bin contain a positive-going signal, a +Peak decimation algorithm is applied, and a value 324 of the most-positive 314 of the data points 310 within the particular bin is delivered as the output value. Bin 2 and Bin 4 of FIG. 3 were determined to contain signal, and the detection type was +Peak, so the most positive data point 314 was selected as the proper output for those bins. If instead an Averaging process would have been selected, then the average of all the points within the bin, illustrated as a dotted line 326 would have instead been output. Thus, using the automatic detection methods of embodiments of the invention provide the user of the test and measurement system gets a more accurate representation for analysis of the signal under test.

Figure 4:
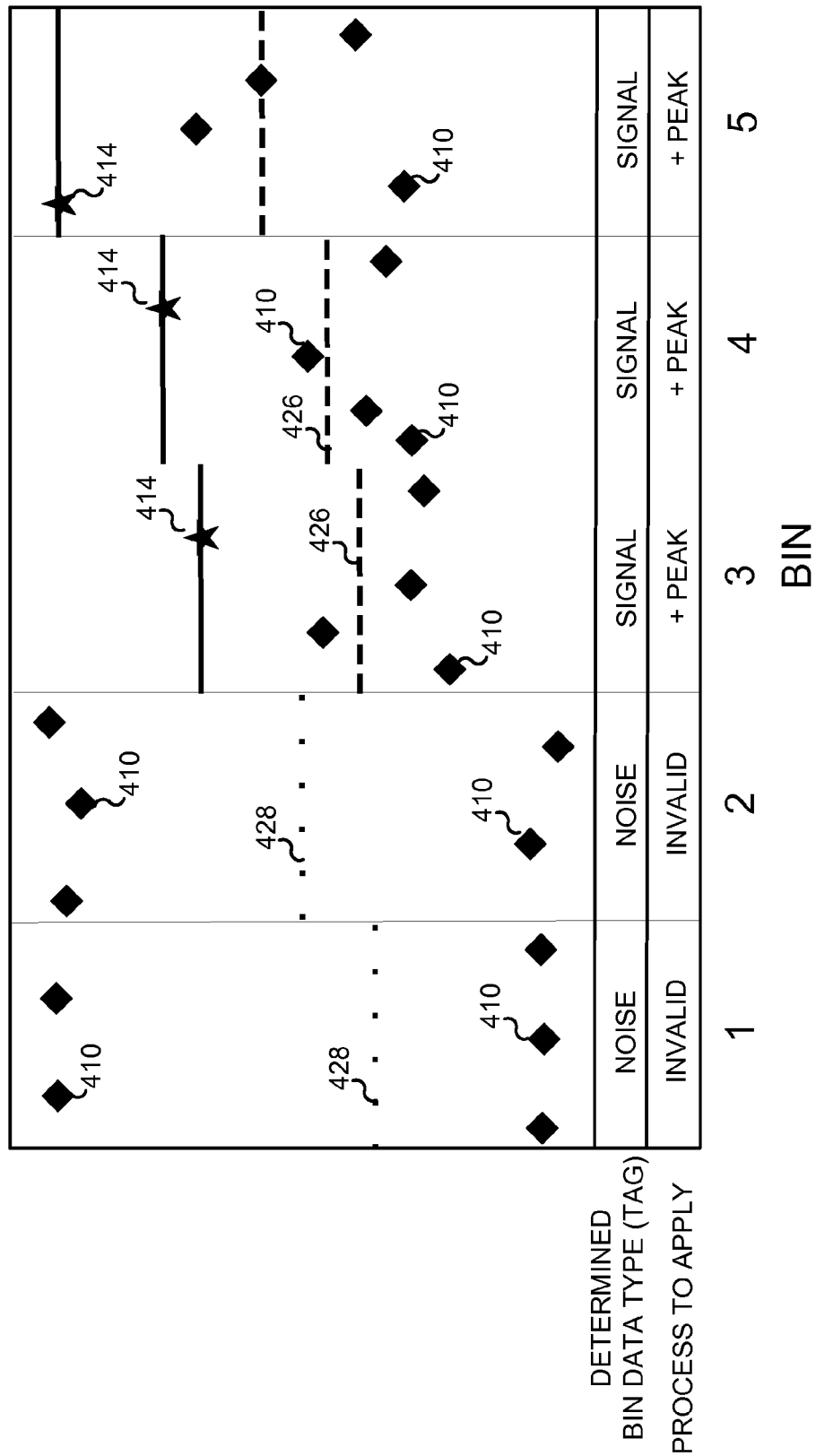
FIG. 4 is a conceptual diagram illustrating data points in example bins, the determined bin data type, the process applied to the data in the bins, and the resultant bin output.

FIG. 4 is similar to FIG. 3, but another process was selected for bin processing. In the example of FIG. 4, an "Invalid" plus +Peak is selected. This means that the processor will analyze data within each of the bins, and determine if they contain signal or invalid data. Invalid data is represented in Bin 1 and Bin 2, where a single output from data points 410 cannot be accurately represented, because values of the individual data points 410 vary widely. Some of the data points 410 are well above what would be an average line 428, while others are well below. An average of the data points 410 would not accurately reflect the data within the bin, and therefore the output is tagged as invalid because of this divergence. In Bin 3, Bin 4, and Bin 5, conversely, the data points 410 contain signal, and, since a +Peak detector was selected, the highest of the data points, point 414, was chosen in each case as the output of the respective bin. If instead another type of detector had been selected, such as +/− Peak, Quasi-Peak, Average, or others, then another of the data points 410, or an average, may have been generated as the bin output.

Using embodiments of the invention, the final output array of the process, which may be shown on a display output of the test and measurement device as a graph trace, represents the true value of signals, even when they are narrower than one frequency bin. It also represents the noise points in the manner expected by users because it does not artificially raise the measured noise level, as it would if it applied the same +Peak decimation to those bins as it did to the signal bins.

Thus, embodiments of the invention include a test and measurement instrument with a selector that is structured to determine whether the value of the data points within a present bin of the several bins of the data array represent signal or noise. For instance, the selector may be embodied in the digital signal processor 134 of FIG. 1. The digital signal processor 134 or another processor is structured to generate a first output for the present bin when the present bin contains noise, and also structured to generate a second output for the present bin when the present bin contains signal. For example, with reference to FIG. 3, the output for Bin 1 is represented as the average value 320, while the output for Bin 2 is represented as a value 324, which equals the measured value for the data point 314.

In practice, the test and measurement instrument may also tag the output of the bins so that the user may determine which process was performed when selecting and output, or "compressing" the binned data. In a final output, a waveform or other display may then represent not only the output from the measurement device, but also distinguish the output data on the final display output. The output data may be distinguished by, for example, different colors, shapes, brightness levels, etc. of the differently tagged data. For example averaged data may appear blue, while +Peak data may appear yellow on a color display.

FIG. 5 is a functional block diagram of components of a system that compresses data based on dynamic considerations according to embodiments of the invention. These functions may be practiced on a processor of the device, such as within the processing block 130 of FIG. 1. An input signal may be processed in various ways, as described above. In FIG. 5, a detector selector 510 either automatically or allows a user to select particular detectors to operate on the binned data before being assembled into a final output of the test and measurement device. For example detectors may include +Peak 520, +/−Peak 521, −Peak 522, Average 523, or another type of detector 524, such as Quasi-Peak or others. Another selector 540 allows selection between data that is tagged as invalid 550 or, especially useful in the case of noise, an average process 551. Similar to the detector selector 510, the selector 540 may be an automatic selector or one that is selected by a user.

In processing, each bin is evaluated to determine if it includes noise or signal in a process 560. If noise, then the selector 540 determines if the bin output will be an average of the data points within the bin, or tagged as invalid. If instead the evaluation 560 determines that the bin data contains signal, the detector selected by the selector 510 will process the data in the bin according to the selected detector. For example, the most negative data point in the bin would be the bin output if the −Peak data detector were selected. Finally, the output of the noise-or-signal process 560 causes the appropriate data to be the final, "compressed" output for each particular bin. The outputs from all the bins are then produced into a final output, as described above.

Although many of the embodiments described above include a user interface, it will be appreciated that in other embodiments, those parameters may alternatively be determined automatically by a test and measurement instrument Although the embodiments illustrated and described above show the present invention being used in a real-time spectrum analyzer, it will be appreciated that embodiments of the present invention may also be used advantageously in any kind of test and measurement instrument that displays frequency or time domain signals, such as a swept spectrum analyzer, a signal analyzer, a vector signal analyzer, an oscilloscope, and the like.

In various embodiments, components of the invention may be implemented in hardware, software, or a combination of the two, and may comprise a general purpose microprocessor, a digital signal processor (DSP), an application specific integrated circuit (ASIC), a field-programmable gate array (FPGA), or the like.

It will be appreciated from the forgoing discussion that the present invention represents a significant advance in the field of test and measurement devices. Although specific embodiments of the invention have been illustrated and described for purposes if illustration, it will be understood that various modifications may be made without departing from the sprit and scope of the invention. Accordingly, the invention should not be limited except as by the appended claims.

What is claimed is:

1. A test and measurement instrument comprising:
an input for receiving an input test signal;
a separator structured to separate a data array of the input test signal into a plurality of data bins, each data bin including a number of data points;
a selector structured to determine whether the data points data within a present bin of the plurality of bins of the data array represent signal or noise; and
a processor structured to generate a first output for the present bin when the present bin contains noise, and structured to generate a second output for the present bin when the present bin contains signal.

2. The test and measurement instrument of claim 1, in which the processor is structured to generate an averaged output from the data points in the present bin when the present bin contains noise.

3. The test and measurement instrument of claim 1, in which the processor is structured to tag an output of the present bin as invalid when the present bin contains noise.

4. The test and measurement instrument of claim 1, in which the processor is structured to select a peak data point of the data points within the present bin when the present bin contains signal.

5. The test and measurement instrument of claim 1, in which the processor is structured to output a quasi-peak data point from the data points within the present bin when the present bin contains signal.

6. The test and measurement instrument of claim 1, in which the processor is structured to output an average data point from the data points within the present bin when the present bin contains signal.

7. The test and measurement instrument of claim 1, further comprising an output assembler structured to produce a waveform display from the bin outputs of the plurality of bins.

8. The test and measurement instrument of claim 7, in which the waveform display from the output assembler distinguishes between bin outputs that contain noise and bin outputs that contain signal.

9. The test and measurement instrument of claim 8, in which the waveform display from the output assembler is distinguished by appearance.

10. The test and measurement instrument of claim 8, in which the waveform display from the output assembler is distinguished by color.

11. The test and measurement instrument of claim 8, in which the waveform display from the output assembler is distinguished by shape.

12. The test and measurement instrument of claim 8, in which the waveform display from the output assembler is distinguished by brightness values.

13. A method in a test and measurement device, comprising:
accepting a digitized signal for testing, the digitized signal structured as a plurality of data bins, each data bin containing a plurality of data points;
determining if the data points in a present bin of the plurality of data bins represent signal or noise;
outputting a first value as an output for the present bin when the present bin contains noise; and
outputting a second value as an output for the present bin when the present bin contains signal.

14. The method of claim 13 in which outputting a first value as an output for the present bin when the present bin contains signal comprises outputting a value of the data point having the greatest magnitude of the plurality of data points in the present bin.

15. The method of claim 14, further comprising associating the output for the present bin with an identifier that records whether the present bin contains noise or signal.

16. The method of claim 15, further comprising generating a test and measurement output from the output value of each bin.

17. The method of claim 16, further comprising displaying the test and measurement output.

18. The method of claim 17 in which, in the test and measurement output, the values of the present bin identified as containing noise are displayed differently from the values of the present bin identified as containing signal.

19. The method of claim 18 in which the difference is color.

20. The method of claim 18 in which the difference is brightness.

21. The method of claim 18 in which the difference is shape.

* * * * *